United States Patent
Geefay et al.

(10) Patent No.: US 6,903,012 B2
(45) Date of Patent: Jun. 7, 2005

(54) SLOPED VIA CONTACTS

(75) Inventors: Frank S Geefay, Cupertino, CA (US); Qing Gan, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/826,803

(22) Filed: Apr. 15, 2004

(65) Prior Publication Data

US 2004/0198040 A1 Oct. 7, 2004

Related U.S. Application Data

(62) Division of application No. 10/029,193, filed on Dec. 20, 2001.

(51) Int. Cl.$^7$ ................................. H01L 21/44
(52) U.S. Cl. ................. 438/667; 438/668; 438/673; 438/928
(58) Field of Search ................. 438/667, 668, 438/673, 928, 978; 257/774–776

(56) References Cited

U.S. PATENT DOCUMENTS

| | | | | |
|---|---|---|---|---|
| 5,536,677 A | * | 7/1996 | Hubacher | 438/613 |
| 6,184,060 B1 | * | 2/2001 | Siniaguine | 438/106 |
| 6,326,689 B1 | * | 12/2001 | Thomas | 257/734 |
| 6,485,814 B1 | * | 11/2002 | Moriizumi et al. | 428/210 |
| 6,662,419 B2 | * | 12/2003 | Wang et al. | 29/25.35 |

* cited by examiner

*Primary Examiner*—Hsien-Ming Lee

(57) ABSTRACT

A sloped via contact is used to connect a contact on the front side of a wafer to a contact on the back side of the wafer. The walls of a small (less than 50–80 microns wide) via have typically been difficult to coat with metal. The present invention forms a small via with sloped walls, allowing easy access to the inside walls of the via for metal sputtering or plating. The small via can be formed using a dry etch process such as the well-known deep reactive ion etching (DRIE) process. Using any isotropic plasma etch process, the walls of the via are further etched from the wafer backside to create sloped walls in the via. The via is then coated with metal to make it conductive.

15 Claims, 9 Drawing Sheets

SLOPED VIA CONTACTS

This is a Divisional of copending application Ser. No. 10/029,193, filed on Dec. 20, 2001, the entire disclosure of which is incorporated herein by reference.

FIELD OF THE INVENTION

The invention is directed towards semiconductor wafer manufacturing and more specifically, towards contact vias in semiconductor wafers.

BACKGROUND OF THE INVENTION

Semiconductor chips are often electrically connected to external circuitry using wire bonds. Wires are connected between contact pads on the chip surface and the desired external circuitry. However, the wire length adds unwanted resistance and inductance to the system, which can negatively affect the performance of the chip. This is especially true of chips designed for use at higher frequencies. Furthermore, the contact pads on the chip surface increase the area of each chip, which decreases the number of chips that can be manufactured on a single wafer. Wire bonding is also an expensive and time-consuming assembly process.

In some applications, wire bonding is replaced with conductive, metal-coated vias that run through the wafer to connect a contact on the front of the chip to a contact pad on the back of the chip. A contact pad is generally larger than a contact, since contact pads are usually used to connect to larger, external circuitry. By placing contact pads on the back of the chip, the over-all surface area of the chip can be reduced since these contact pads can overlap the device on the front of the chip. Furthermore, the contact pads on the back of a chip can be directly connected to external circuitry by ball bump or other technologies, thus eliminating the need for wire-bonding altogether.

Metal-coated vias work well when the via is large. However, it is difficult to coat the walls of a very small via—a via that is less than 50–80 microns wide at its widest. Due to the steep walls and the diminutive opening of a small via, it is difficult to get enough metal into the via and onto its walls to ensure a solid, reliable contact.

SUMMARY OF THE INVENTION

The present invention creates a sloped via contact through a chip, allowing a device on the front of a chip to be electrically connected to a contact pad on the back of a chip. The sloped via contact is small (only 5–20 microns wide at its narrowest at the front, and 20–80 microns wide at the back), but its sloped walls allow a metal coating to be easily applied. The opening of the sloped via contact can be any shape, such as a circle, oval, or a rectangle. Its length can vary as well, depending on the amount of resistance that can be tolerated in the sloped via contact.

By using a sloped via contact rather than a bonded wire, a signal from a device on the front of the chip can take a much shorter path to the external circuitry. For high frequency applications, this results in very low signal losses from the device to the external circuit leads. Additionally, since the contact pads at the back of the chip may be located under the device on the front of the chip, contact pads are no longer needed on the front of the chip. This reduces the overall chip area, thus creating higher chip density on the wafer. The sloped via contact also lends itself to inexpensive assembly processing by eliminating the need for wire bonding.

Further features and advantages of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

Figure 1A:
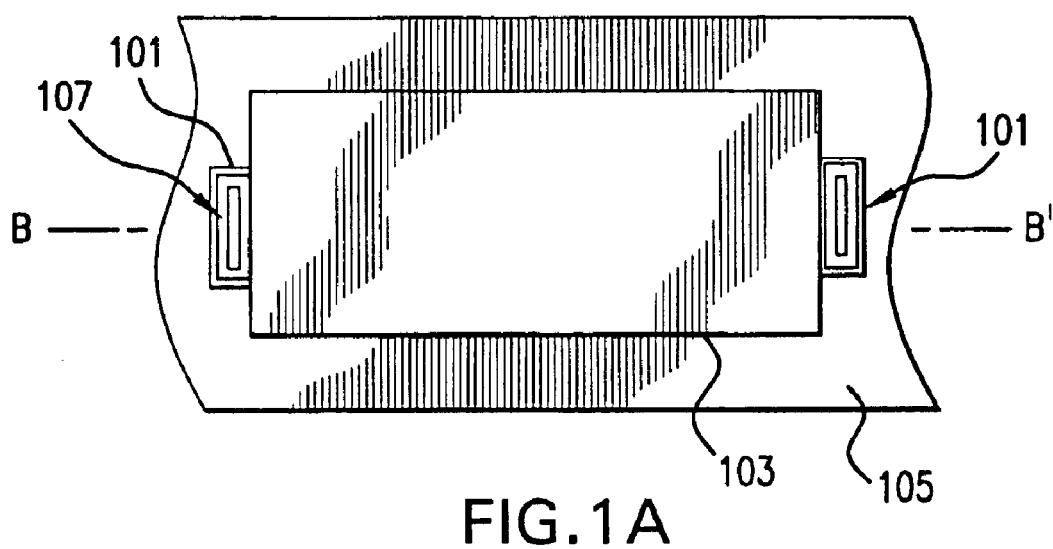
FIG. 1A is a top view of a wafer section having two sloped via contacts.

FIG. 1A shows a top view of a preferred embodiment of a wafer section having sloped via contacts made in accordance with the teachings of the present invention. Contacts 101 are connected to a device 103 on the front of a wafer 105. The opening of a sloped via contact 107 is located within each contact 101. Although contacts 101 and sloped via contacts 107 are shown with a rectangular shape, contacts 101 and sloped via contacts 107 can be circular, square, oval, or any other shape. Additionally, although each sloped via contact 107 is shown centered within a contact 101, sloped via contact 107 can be positioned anywhere within contact 101 as long as an electrical connection is made between them, and no interference occurs with connections to external circuitry.

Figure 1B:
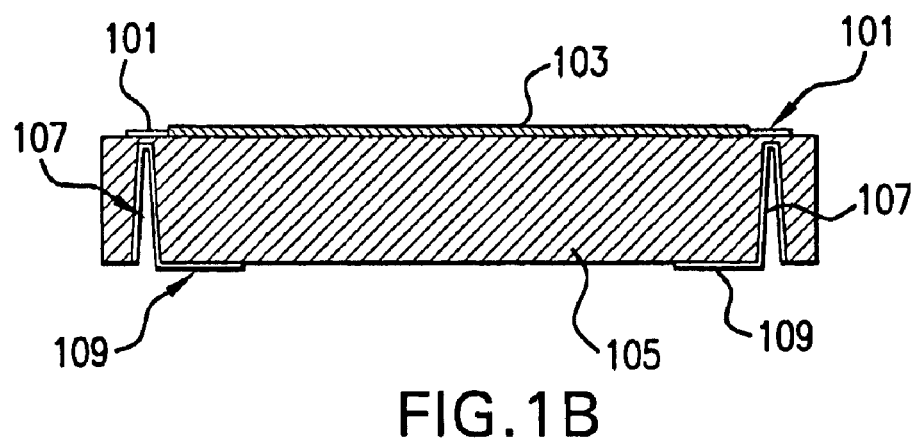
FIG. 1B is a cross-sectional view of the wafer section in FIG. 1A, taken along the line B–B'.

FIG. 1B shows a cross-sectional view of the wafer section of FIG. 1A, taken along the line B–B' in FIG. 1A. Sloped via contacts 107 gradually increase in width from front to back of wafer 105, so that each sloped via contact 107 is wider at the back of wafer 105 than at the front. Contact pads 109 are located on the back of wafer 105. Each contact 101 is connected to a corresponding contact pad 109 by a sloped via contact 107. Contact pads 109 are shown in the figure to be larger than the contacts 101. However, contact pads 109 can be the same size or even smaller than the contacts 101.

Figure 2:
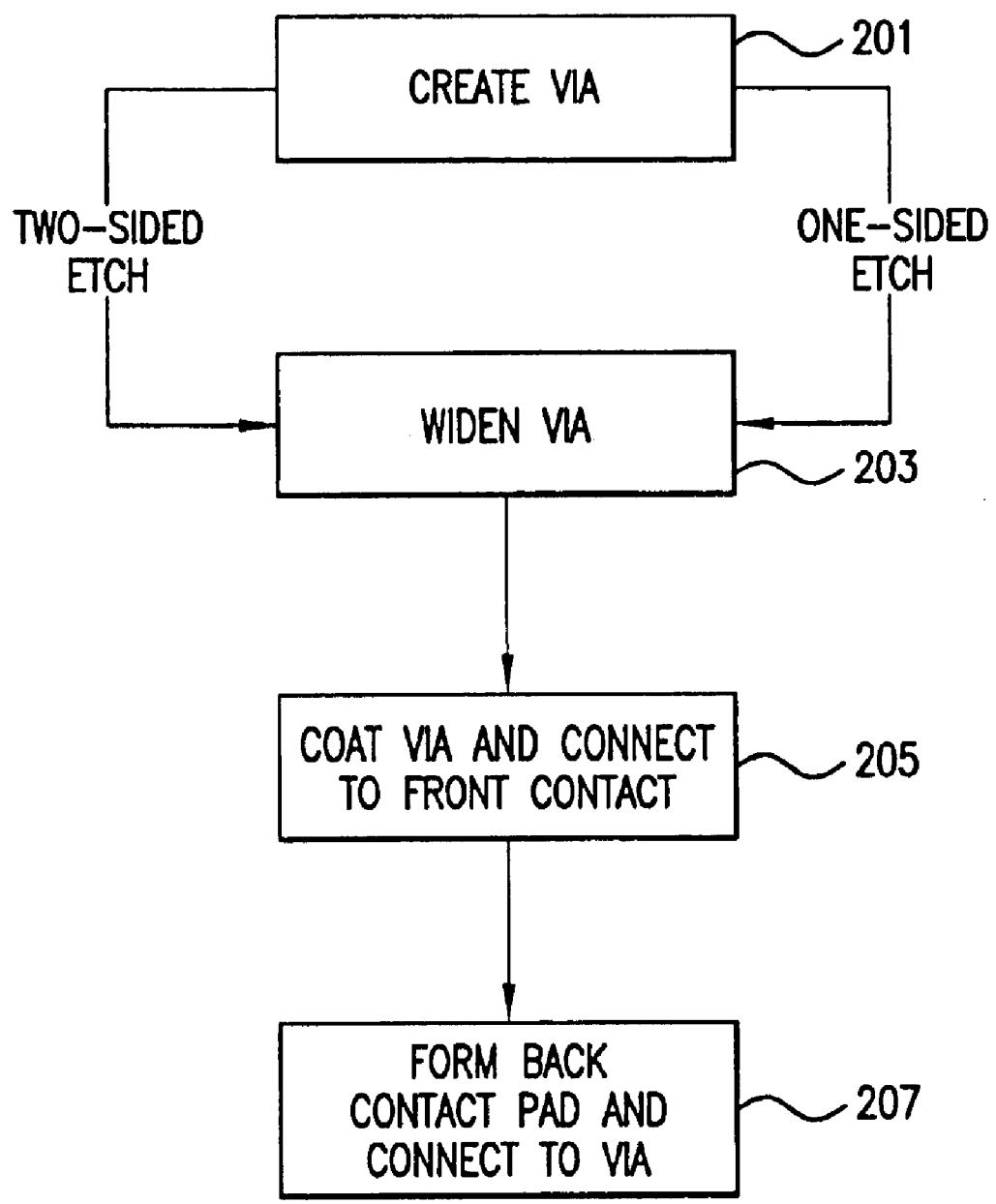
FIG. 2 is a flowchart describing the process of fabricating a sloped via contact.

FIG. 2 is a flowchart describing the process of fabricating a sloped via contact. In the first step, Step 201, a via is created in the wafer where the sloped via contact will be located. The via is simply a hole in the wafer, a channel leading from the front side of the wafer to the back. There are at least two ways to create the via: either by a two-sided etch, or a one-sided etch. As the name implies, in a two-sided etch, the via is created by etching from both the front and back sides of the wafer. In a one-sided etch, the via is created by etching only from the back of the wafer. A conventional etching process, such as a deep reactive ion etching (DRIE) dry etch, may be used. After the via is created, it is widened from the back in Step 203 so that the via gradually increases in width from front to back. Next, in Step 205, the via is coated with a conductive material to make an electrical connection to the front contact. Finally, in Step 207, a contact pad is created on the back of the wafer that connects to the front contact through the sloped via contact.

FIGS. 3A–3E illustrate the two-sided etching method for creating a sloped via in the wafer.

Figure 3A:
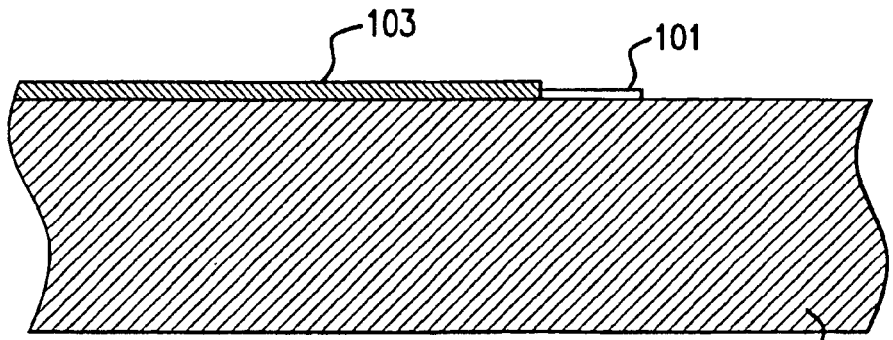
FIGS. 3A–3E show side views of the wafer section during the steps of creating a sloped via using a two-sided etch.

FIG. 3A shows wafer 105 with device 103 and contact 101 on the front side of wafer 105. Device 103 is any microelectronic device such as a microelectromechanical system (MEMS) structure or electronic circuit. Wafer 105 is made of very high resistivity float zone silicon so it will not create RF coupling problems with device 103 or any adjacent vias. Wafer 105 can also be made of materials other than silicon, such as glass, ceramics, or other high resistivity semiconductor material, without departing from the scope of the present invention. In actual working embodiments, the wafers were between less than 50 microns to greater than 250 microns thick. These sizes are disclosed for illustrative purposes only. It should be understood that other wafer sizes can be used to achieve the same results. Contact 101 is typically made of metal such as Nichrome-gold, although other metals can be used as well.

Figure 3B:
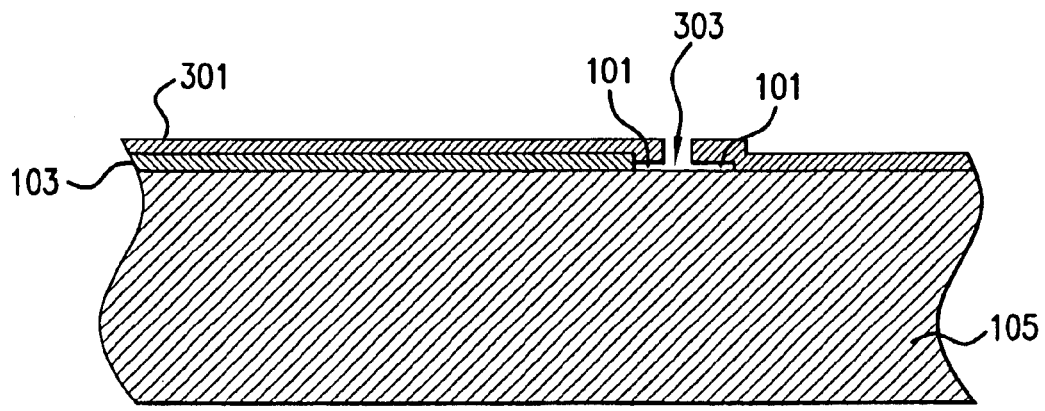

In FIG. 3B, a layer of photoresist 301 has been deposited, exposed, and developed in a conventional photolithographic process to create an opening 303 in contact 101. Opening 303 is smaller than contact 101, and is completely contained within contact 101.

Figure 3C:
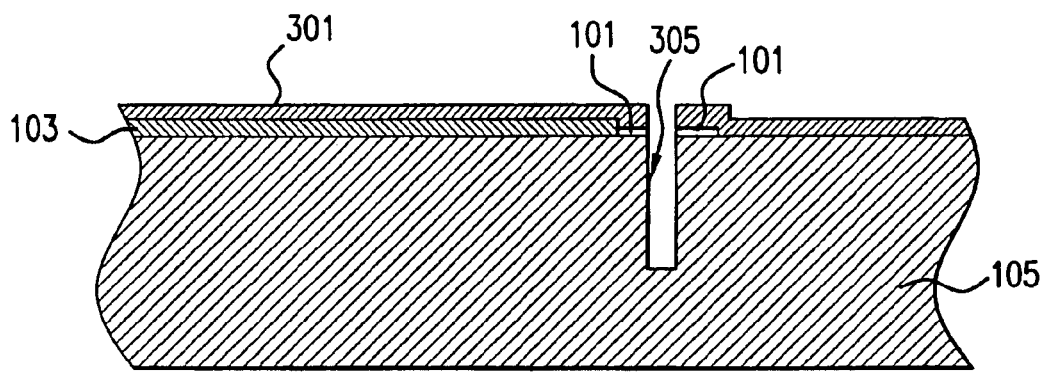

FIG. 3C shows wafer 105 after it has been etched to create a via 305. Via 305 should be etched slightly deeper than the final target thickness of wafer 105 after processing. A conventional etching process, such as a dry etch, may be used. One such process is deep reactive ion etching (DRIE), a process well known in the art. DRIE alternates an etching cycle with a polymer coating cycle. The coating cycle deposits a polymer on the etched walls, protecting them during the etching cycle. By alternating cycles, this process enables very deep etching with little undercutting, which results in well-defined, sharp geometries. It is possible and advantageous to use this technology to etch the via with negatively sloped walls, which results in a via that is narrower at its opening at the front of the wafer than at the back of the wafer.

Figure 3D:
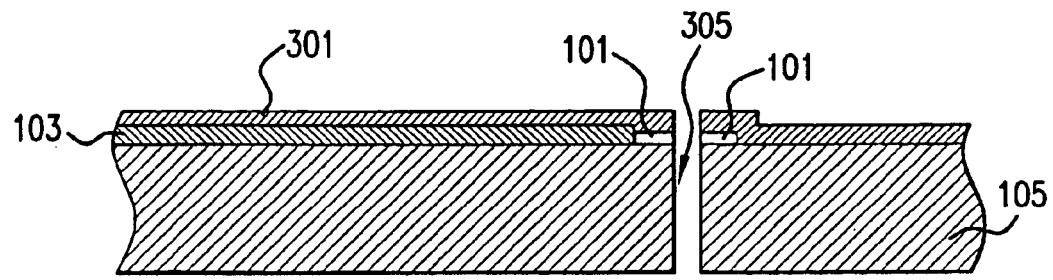

In FIG. 3D, wafer 105 has been ground down or otherwise thinned to expose via 305 at the back of wafer 105. Any standard grinding or thinning process may be used. In preparation for the next etching step, the polymers deposited during the coating cycle of the DRIE process are removed from the walls of via 305 by any conventional polymer stripper, such as oxygen plasma.

Figure 3E:
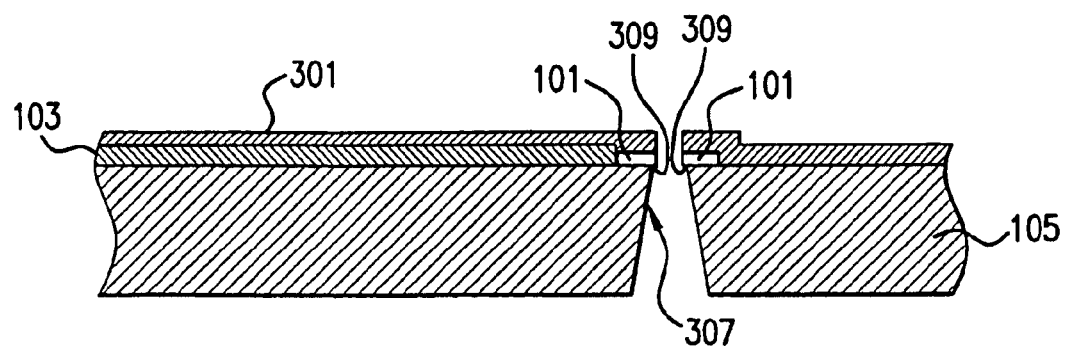

In FIG. 3E, wafer 105 has been etched from the back side to widen via 305 (shown in FIG. 3D). Any isotropic plasma etching process may be used. The back of via 305 is exposed to more etchant and is etched more rapidly than the front. This will naturally create a sloped via 307 that is wider at the back of wafer 105 and narrower at the front. During this etch, some of the silicon under contact 101 may optionally be etched away, leaving a slight overhang 309 of contact 101. The overhang 309 allows sputtered metal (applied in an upcoming process step) to more easily make a connection to contact 101. This etch also slightly thins the wafer further, and relieves some of the stress and damage done to the backside of the wafer during the grinding/thinning step described in FIG. 3D.

FIGS. 4A–4F show the one-sided etching method for creating a sloped via.

Figure 4A:
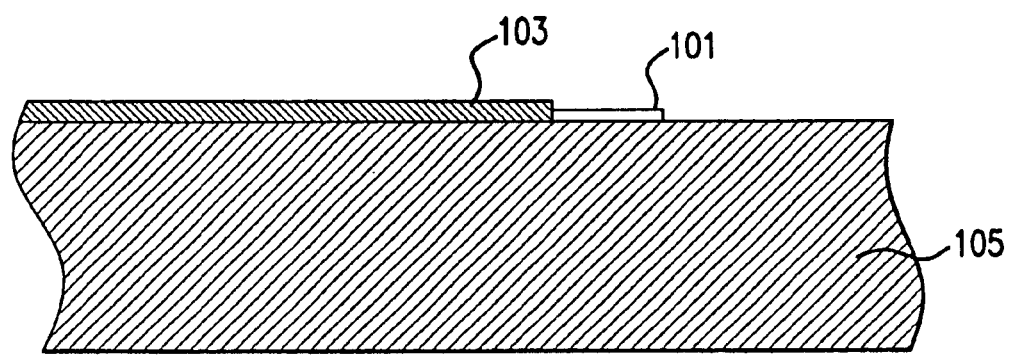
FIGS. 4A–4F show side views of the wafer section during the steps of creating a sloped via using a one-sided etch.

FIG. 4A shows wafer 105 with device 103 and contact 101 on the front of wafer 105. In a one-sided etch, a via is etched from the back of wafer 105. Therefore, the pattern etched on the back of wafer 105 must be aligned to the pattern etched on the front, in order to etch the via in the correct place underneath contact 101. Any conventional alignment technique may be used. One method for aligning the front and back of the wafer is to use DRIE to etch an alignment pattern. Another possibility is to use a commercially available two-side alignment machine.

Figure 4B:
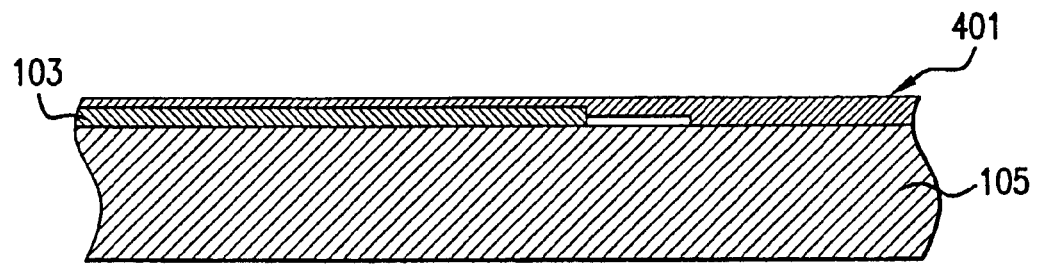

In FIG. 4B, a protective layer of photoresist 401 has been deposited onto wafer 105. Wafer 105 is then thinned down by conventional means such as grinding. Since wafer 105 will be slightly thinned down further during an etch later on in the process, care should be taken not to thin wafer 105 too much in this step.

Figure 4C:
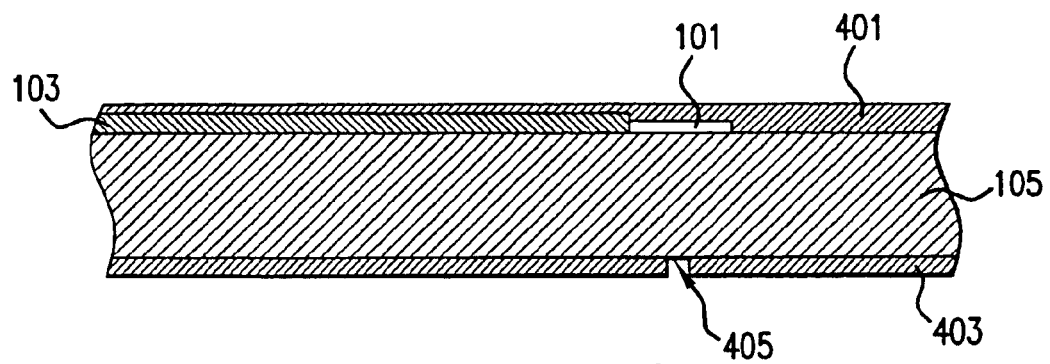

In FIG. 4C, the back of wafer 105 has been masked with photoresist 403 to create the desired via pattern 405. The alignment provided earlier in the process is used to position the via correctly underneath contact 101.

Figure 4D:
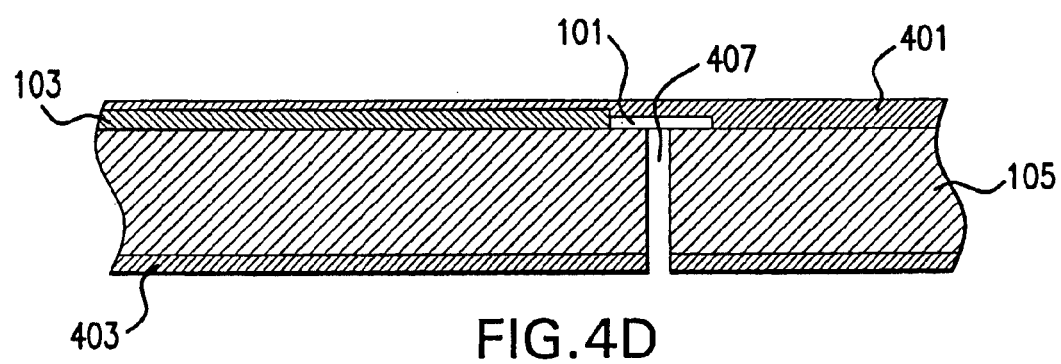

FIG. 4D illustrates wafer 105 after it has been etched from the back side using a DRIE process to create a via 407. Unlike the two-sided etch shown in FIGS. 3A–3E, the one-sided etch does not etch through contact 101 on the front of wafer 105.

Figure 4E:
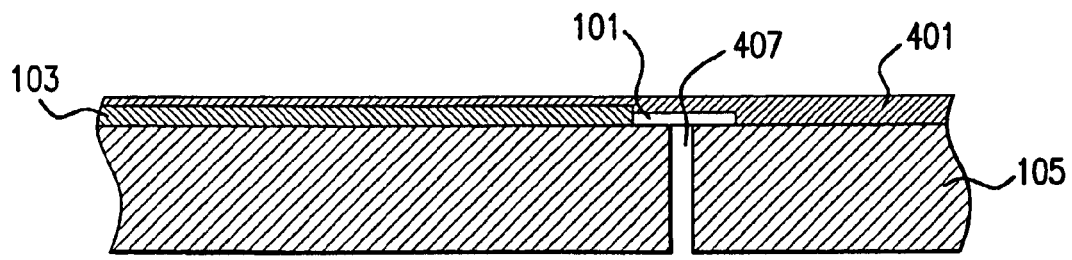

In FIG. 4E, photoresist 403 (shown in FIG. 4D) has been stripped from the back of wafer 105. In preparation for the next etching step, the polymers deposited during the coating cycle of the DRIE process are removed from the walls of via 407 using conventional polymer strippers such as oxygen plasma.

Figure 4F:
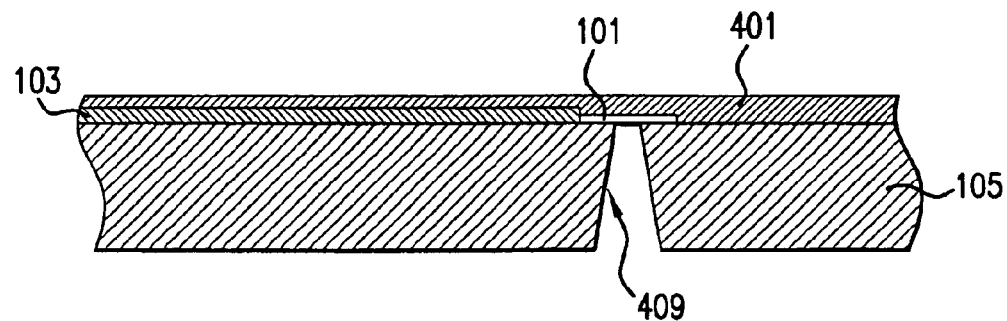

FIG. 4F shows wafer 105 after it has been etched from the back to widen via 407 (shown in FIG. 4E). Any isotropic plasma etching processes may be used. The back of via 407 is exposed to more etchant and is etched more rapidly than the front. This will naturally create a sloped via 409 that is wider at the back of wafer 105 and narrower at the front.

FIGS. 5A–5D show the wafer as the sloped via is processed into a sloped via contact. FIGS. 5A–5D depict a sloped via 409 (shown in FIG. 4F) created by a one-sided etch, but the steps shown in FIGS. 5A–5D are just as applicable to a sloped via 307 (shown in FIG. 3E) created by a two-sided etch.

Figure 5A:
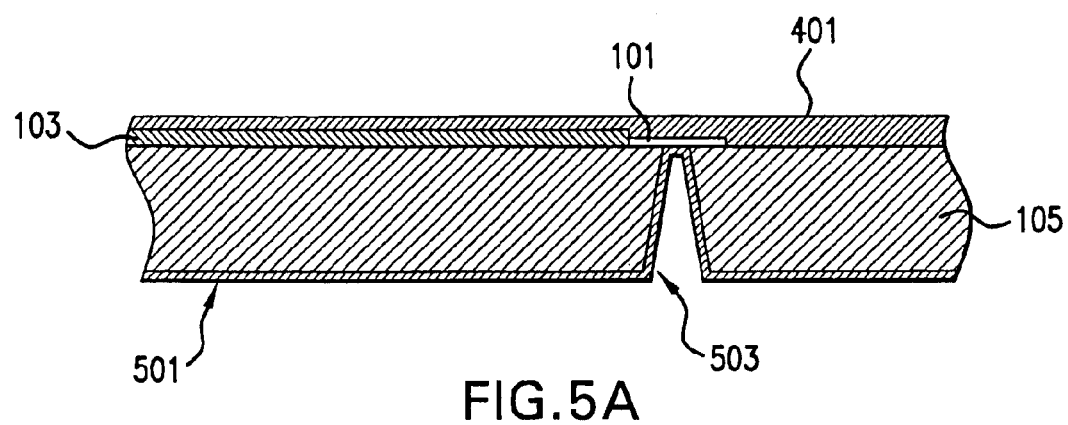
FIGS. 5A–5D are side views of the wafer section as a sloped via is processed into a sloped via contact.

In FIG. 5A, a metal coating 501 such as Nichrome/gold (NiCr/Au) is sputtered or otherwise deposited onto the back of wafer 105. Best results are achieved when the deposition technology has very good step coverage. There is currently about a 10:1 thickness ratio between the metal sputtered onto the wafer backside and the metal that accrues on the walls of the sloped via 409 (shown in FIG. 4F) near top contact 101. This ratio may vary depending upon the width, slope, and depth of the via. In an actual working embodiment, 1500 Angstroms of Nichrome and 10,000 Angstroms of gold were sputtered onto the wafer backside in order to obtain a metal coating approximately 1150 Angstroms thick inside the sloped via 409. These figures are disclosed for illustrative purposes only—other amounts of metal can be used to achieve a working embodiment. The metal thickness inside sloped via 409 is measured where the via width is the narrowest, and must have a resistance low enough for its desired application. A thicker metal coating will have a lower resistance than a thinner metal coating. After the metal coating is deposited, sloped via 409 becomes a sloped via contact 503.

Figure 5B:
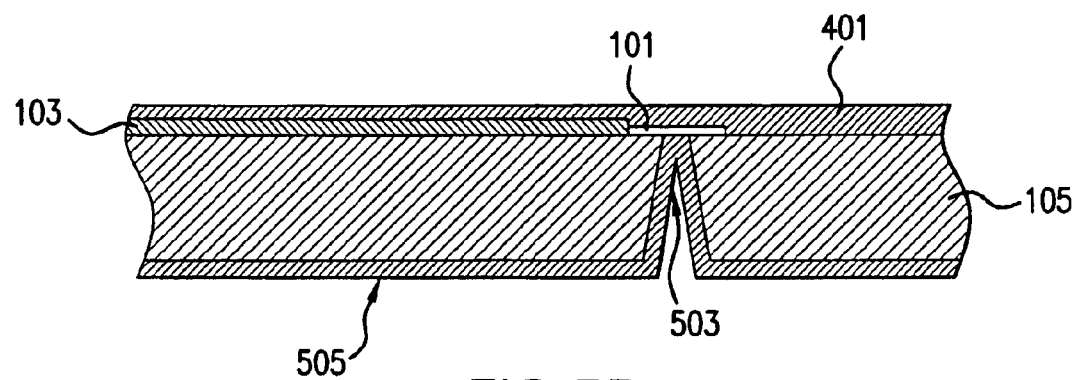

The metal layer deposited in FIG. 5A is thick enough for some applications. However, other applications may require the vias to have lower resistance. In such cases, the walls of sloped via contact 503 can be plated with even more metal 505, as shown in FIG. 5B, to further reduce resistance. In actual working embodiments, a plating of 1.5–3 um has been found to be sufficient for most purposes. The sloped via contact 503 can also be plated until it is completely filled such as with copper via plating.

Figure 5C:
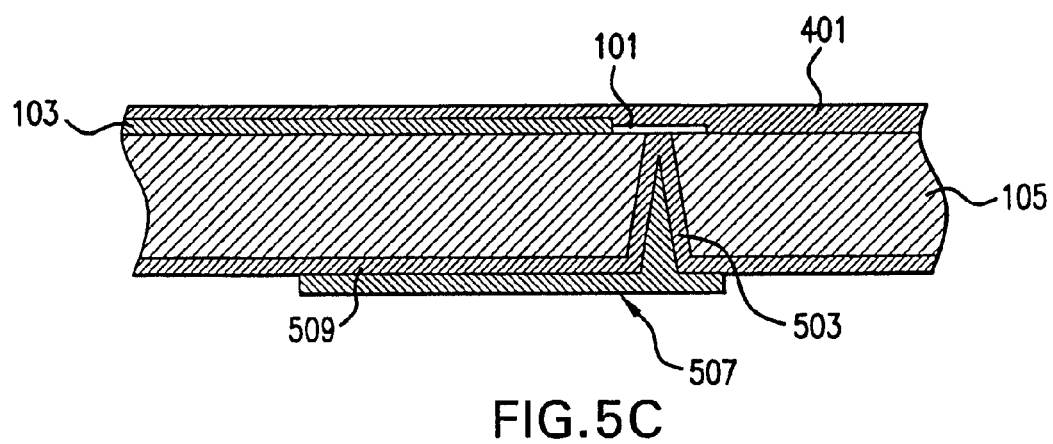

In FIG. 5C, photoresist 507 has been applied to the back side of wafer 105 to cover sloped via contact 503 and to mask off a contact pad 509. Any exposed metal is then etched from wafer 105.

Figure 5D:
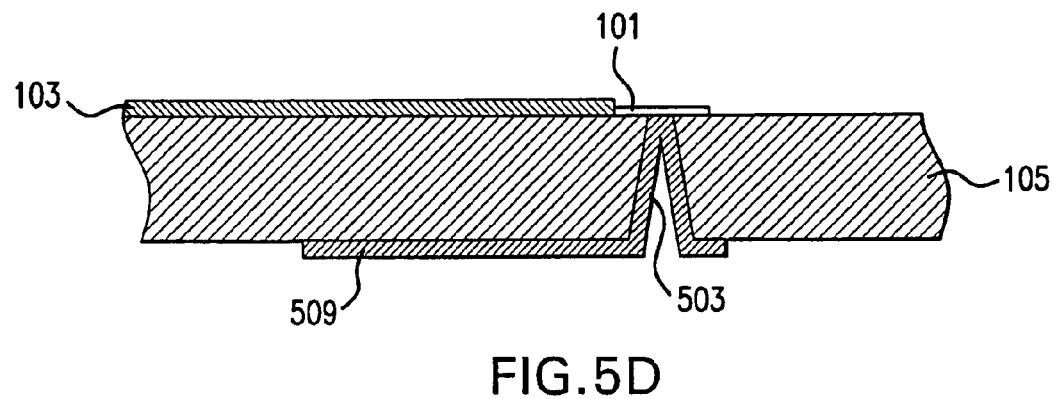

FIG. 5D shows wafer 105 after all remaining photoresist 401 and 507 (shown in FIG. 5C) has been removed. Contact pad 509 is connected to front contact 101 through sloped via contact 503.

Figure 6A:
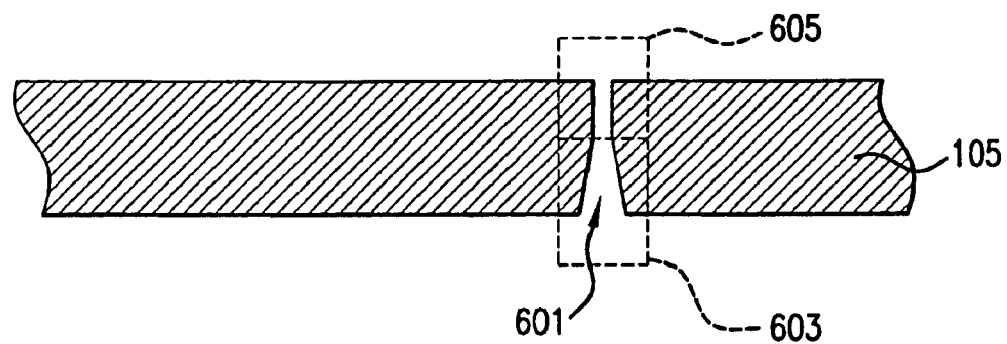
FIGS. 6A–6B are side views of other possible shapes for sloped vias.
Figure 6B:
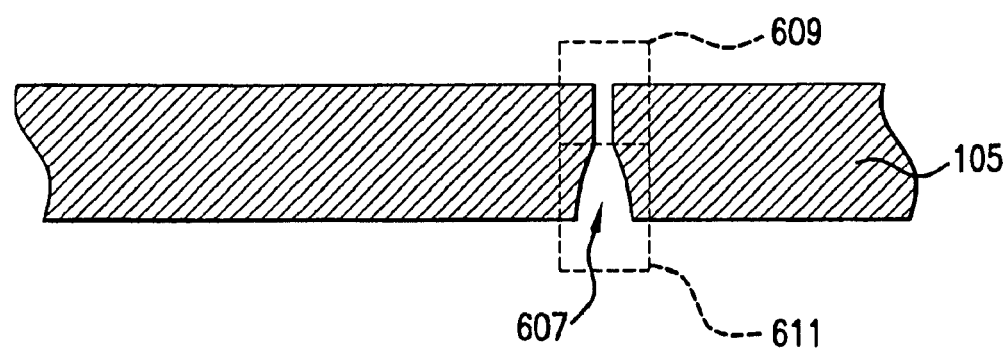

By changing process variables such as bias voltage, etch time, etc., it is possible to obtain different shapes for the sloped via contact. FIGS. 6A–6B are side views of two of the many possible shapes. The sloped vias are shown uncoated with metal for the sake of clarity in the figure.

FIG. 6A shows a sloped via 601 in wafer 105. Sloped via 601 has regions 603 and 605. The via walls in region 603 have a different slope from the walls in region 605.

FIG. 6B shows a sloped via 607 in wafer 105. Sloped via 607 with regions 609 and 611. The via walls in region 609 are straight, whereas the via walls in region 611 are curved.

Although the present invention has been described in detail with reference to particular preferred embodiments, persons possessing ordinary skill in the art to which this invention pertains will appreciate that various modifications and enhancements may be made without departing from the spirit and scope of the claims that follow.

We claim:

1. A method for creating a via contact from a microelectronic device on a front side of a wafer to a back side of the wafer, comprising:

forming a via defined by sidewalls and extending through the wafer from a contact of the microelectronic device to the back side of the wafer, wherein the via has a width of at most 80 $\mu$m and at least a portion of the via has sloped sidewalls and a width that increases with distance through the wafer;

coating the sidewalls of the via with conductive material; and forming on the back side of the wafer a back contact that is electrically connected to the contact of the microelectronic device through the conductive material coating the sidewalls of the via.

2. The method of claim 1, wherein the width of the via is at most 50 um.

3. The method of claim 1, wherein the coating of the sidewalls leaves a coating of conductive material at least 1000 Angstroms thick on the sidewalls where the via width is narrowest.

4. The method of claim 3, wherein the conductive material is selected from the group consisting of NiChrome and gold.

5. The method of claim 3, wherein the coating of the sidewalls includes plating.

6. The method of claim 1, wherein the forming of the via comprises:

forming in the wafer a preliminary via with a substantially constant width; and widening at least a portion of the preliminary via to form the portion of the via having sloped sidewalls.

7. The method of claim 6, wherein the forming of the via comprises etching the wafer with a deep reactive ion etching (DRIE) process.

8. The method of claim 7, wherein the forming of the via comprises etching the wafer from only one of the front and back sides of the wafer.

9. The method of claim 7, wherein the forming of the via comprises etching the wafer from both the front and back sides of the wafer.

10. The method of claim 6, wherein the widening of the via comprises etching the wafer with an isotropic plasma etch.

11. The method of claim 1, wherein the forming of the via comprises forming the portion of the via having sloped sidewalls with a width that increases from the contact of the microelectronic device to the back side of the wafer.

12. The method of claim 1, wherein the portion of the via having sloped sidewalls extends from the contact of the microelectronic device to the back side of the wafer.

13. The method of claim 1, wherein the via has a non-sloped portion.

14. The method of claim 1, wherein the portion of the via having sloped sidewalls varies linearly with distance through the wafer.

15. The method of claim 1, wherein the portion of the via having sloped sidewalls varies nonlinearly with distance through the wafer.

* * * * *